United States Patent [19]
Yoshikawa et al.

[11] Patent Number: 5,126,802
[45] Date of Patent: * Jun. 30, 1992

[54] ELECTRIC DEVICE

[75] Inventors: Masao Yoshikawa; Tetsuro Suzuki, both of Yokohama, Japan

[73] Assignee: Ricoh Company, Ltd., Tokyo, Japan

[*] Notice: The portion of the term of this patent subsequent to Apr. 9, 2008 has been disclaimed.

[21] Appl. No.: 605,489

[22] Filed: Dec. 26, 1990

Related U.S. Application Data

[62] Division of Ser. No. 477,484, Feb. 9, 1990, Pat. No. 5,006,915.

Foreign Application Priority Data

Feb. 14, 1989 [JP] Japan ................................. 1-32798
Jun. 6, 1989 [JP] Japan ................................. 1-142081

[51] Int. Cl.⁵ ............................................. H01L 29/28
[52] U.S. Cl. ......................................... 357/8; 357/16
[58] Field of Search ................... 136/263; 357/8, 10, 357/16, 30 E, 30 J

[56] References Cited

U.S. PATENT DOCUMENTS 4,106,951 8/1978 Masi ................................... 136/263
5,006,915 4/1991 Yoshikawa et al. ................ 357/61

FOREIGN PATENT DOCUMENTS 0252756 1/1988 European Pat. Off. ............... 357/8

Primary Examiner—Aaron Weisstuch
Attorney, Agent, or Firm—Oblon, Spivak, McClelland, Maier & Neustadt

[57] ABSTRACT

An electric device comprises a portion comprising an electrode, an n-type inorganic semiconductor layer formed on the electrode, and an electron-conductive organic layer formed on the n-type inorganic semiconductor layer, and a photoelectric conversion device utilizes the above electric device by using the electron-conductive organic layer as an electron acceptor, with addition of an electron donor layer and another electrode thereto.

13 Claims, 1 Drawing Sheet

FIGURE
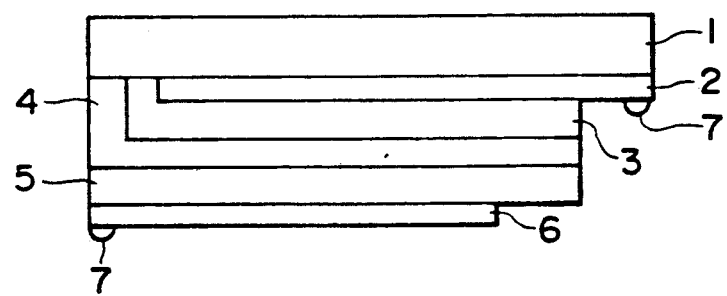

ELECTRIC DEVICE

This is a division of application Ser. No. 477,484, filed Feb. 9, 1990, now U.S. Pat. No. 5,006,915.

BACKGROUND OF THE INVENTION

1. Field of the Invention

This invention relates to an electric device using organic materials, which is applicable to a solar battery, a photoelectric conversion device and a transistor, and more particularly to an electric device comprising a portion in which an electrode, an n-type inorganic semiconductor layer, and an electron-conductive organic layer are successively overlaid in this order.

2. Discussion of Background

Electric devices using inorganic materials have conventionally been used for solar batteries, photoelectric conversion devices and transistors. In recent years, however, electric devices using organic materials have taken over the place of the conventional electric devices. This has been made possible by the recent improvement and diversification in characteristics of organic semiconductors, and the progress of thin-film forming techniques.

It is preferable that such electric devices have an electric current density of 1 mA/cm$^2$ or more. In the case of a solar battery, for instance, a short-circuit photoelectric current density of 10 mA/cm$^2$ or more is necessary in order to attain a conversion efficiency of 5% or more under sunlight. An organic electroluminescent device is also required to have an electric current density of approximately 10 mA/cm$^2$ so as to obtain a luminance as high as 1000 cd/m$^2$. Furthermore, a transistor capable of flowing a great amount of electric current can be utilized for various purposes applications.

As described above, it is an indispensable requirement that the electric device have a high electric current density from the viewpoint of practical use.

In order to attain a high electric current density, it is necessary that both positive holes and electrons can freely move inside the electric device. However, there are few organic materials which can fulfill this requirement In order to satisfy the requirement, it has been proposed that two organic layers, one serving as an electronconductive layer, and the other serving as a positive holeconductive layer, be separately formed.

However, even when the electric device comprises the above two layers, the electric current density decreases in the case where an energy barrier exists therein. The energy barrier is formed at the junction of any two layers made of different materials. Therefore, it is necessary that all junctions except those in a functional site be in ohmic contact which does not hinder the migration of electric charges. In the case of a photoelectric conversion device such as a solar battery, the site in which photoelectric charges are generated is the functional site.

The inventors of the present invention have carefully studied the above proposal, in which two organic layers serving as an electron-conductive layer and as a positive hole-conductive layer are separately formed in order to attain a high electric current density. As a result, problems were found as described below in the materials for a negative electrode.

In general, metals have conventionally been used as the a negative electrode materials. In particular, metals having a work function of less than 4.5 eV have been used so that the negative electrode can be in ohmic contact with an organic semiconductor layer.

For example, a photoelectric conversion device which has a maximum short-circuit electric current density of 3 mA/cm$^2$ is disclosed in Japanese Patent Publication 62-4871. In this device, Ag and In are used as the materials for the negative electrode. It is generally known that these metals are readily oxidized.

With respect to an electroluminescent device, a device using polyvinyl carbazole as a luminescent material has been reported by R. H. Partridge in *Polymer*, 24, 748 (1983). In this device, Cs is used as the material for the negative electrode.

Furthermore, in *Appl. Phys. Lett.*, 51, 913 (1987), C. W. Tang has reported an electric device composed of an aluminum quinoline complex layer and a diamine layer. In this device, the negative electrode is prepared by using an alloy of Mg and Ag, which is also easily oxidized.

It is considered that when metals having a work function of 4.5 eV or more are used as the materials for a negative electrode, the stability of the electrode can be enhanced, and the finished device can withstand practical use.

However, when such metals are used as they are for the electrode, the electric current density of the device is drastically decreased, and the characteristics of the device are deteriorated. This is because a barrier to electron conduction is formed between an electron-conductive organic semiconductor layer and an electrode made of a metal having a work function of 4.5 eV or more.

A photoelectric conversion device is a device which converts light applied thereto to electric energy. In general, a photoelectric conversion device using organic materials has a lower conversion efficiency than a device using inorganic materials. This is because organic materials have a low short-circuit electric current density J$_{sc}$) and a small fill factor (ff).

A device having a conversion efficiency of 5% is required to have a short-circuit electric current density (J$_{sc}$) of at least 10 mA/cm$^2$ when a white light with an intensity of 75 mW/cm$^2$ is applied thereto. However, as will be described later, a known solar battery using organic materials has a short-circuit electric current density which is much lower than the above value, and has an insufficient value of the fill factor (ff). One of the reasons for the low fill factor, is that the quantum efficiency of organic materials drastically decreases in a weak electric field. In order to overcome this problem, the device is required to generate a strong inner electric field. Furthermore, in order to obtain a large fill factor, it is also required that generated electric charges can reach the electrodes without being hindered by an electrical barrier.

Conventional electric devices are classified into three types as described below, depending on the fabrication method thereof.

(1) Electric devices containing a Schottky junction or a metal insulator semiconductor (MIS) junction:

These devices utilize an inner electric field generated at a junction of a metal and a semiconductor layer. Organic materials such as merocyanine dyes and phthalocyanine pigments have been reported as the materials for the semiconductor layer for use in this type device.

An electric device composed of Al, a merocyanine dye and Ag shows a conversion efficiency of 0.7% when a white light with an intensity of 78 mW/cm² is applied thereto, as reported by A. K. Ghosh, et al. in *J. Appl. Phys.*, 49, 5982 (1978). Other data regarding this device are as follows:

Open-circuit electromotive force ($V_{oc}$) = 1.2 V,
Short-circuit current density ($J_{sc}$) = 1.8 mA/cm², and
Fill factor (ff) = 0.25.

Only a p-type organic semiconductor can show a high conversion efficiency, so that metals having a low work function of less than 4.5 eV, such as Al, In and Mg, are employed. These metals are readily oxidized to form an MIS-type junction.

The open-circuit electromotive force ($V_{oc}$) of the device of this type is relatively high. However, since metals having a work function of less than 4.5 eV, such as Al, In and Mg, are used as the materials for the electrode, the electrode has the disadvantages of low transparency and low stability due to oxidation. Practically, the transparency of the electrode is, in general, approximately 10%, and at most approximately 30%. Thus, it cannot be expected that the device of this type can have a high conversion efficiency.

(2) Electric devices containing a hetero p/n junction of an n-type inorganic semiconductor layer and a p-type organic semiconductor layer:

These devices utilize an electric field which is generated when the n-type and p-type semiconductor layers are in contact.

CdS and ZnO are used as the materials for the n-type inorganic semiconductor. Merocyanine dyes and phthalocyanine pigments (Pc) have been reported as the materials for the p-type organic semiconductor.

An electric device composed of ITO, CdS deposited onto the ITO layer, ClAlClPc and Au shows a conversion efficiency of 0.22% when an AM-2 light with an intensity of 75 mW/cm² is applied thereto, as reported by A. Horr, et al. in *Appl. Phys. Lett*, 42, 15 (1983). Other data regarding this device are as follows: $V_{oc}$ = 0.69 V, $J_{sc}$ = 0.89 mA/cm², and ff = 0.29.

An electric device composed of ITO, ZnO, a merocyanine dye and Ag shows a conversion efficiency of approximately 0.5% when a white light with an intensity of 70 mW/cm² is applied thereto, as reported by K. Kudo, et al. in *J. Appl. Phys.*, 19, L683 (1980). Other data regarding this device are as follows: $V_{oc}$ = 0.4 V, $J_{sc}$ = 1.1 mA/cm², and ff = 0.3-0.4.

In the device of this type, electric charges are mainly generated in the organic layer which is generally made of a single organic material, so that the generation of electric charges is affected by the spectral sensitivity of the organic layer. No organic semiconductors have been found until now which are capable of strongly absorbing light in a wide wavelength range of 400 nm to 800 nm.

Therefore, the device of this type can overcome the shortcomings of low transparency and low stability of the device of the above type (1). However, the device is restricted by the spectral sensitivity of the organic material employed, and cannot show a high conversion efficiency.

(3) Electric devices containing a hetero junction of organic layers:

The devices utilize an electric field which is generated when (i) an organic material of n-type or having high electron affinity and (ii) a p-type organic material are in contact.

Dyes such as Malachite Green, Methyl Violet and a pyrylium compound, and condensed polycyclic compounds such as flavanthrone and perylene pigments have been reported as specific examples of the former organic material.

As the latter organic material, phthalocyanine (Pc) pigments and merocyanine dyes have been reported.

An electric device composed of ITO, CuPc, a perylene pigment and Ag shows a conversion efficiency of 0.95% when an AM-2 light with an intensity of 75 mW/cm² is applied thereto, as reported by C. Tang in *Appl. Phys. Lett*, 48, 183 (1986). Other data regarding this device are as follows: $V_{oc}$ = 0.45 V, $J_{sc}$ = 2.3 mA/cm², and ff = 0.65.

With respect to the electric devices containing organic materials, the above value of the conversion efficiency is maximum so far. C. Tang also discloses, in Japanese Patent Publication 62-4871, a device having the same structure as that of the above device but using a perylene pigment of a different type. The conversion efficiency of this device is 1% ($V_{oc}$ = 0.44 V, $J_{sc}$ = 3.0 mA/cm², ff = 0.6).

The device of this type is most preferable among the devices described above since light can be applied to the transparent electrodes. Moreover, photoelectric charges can be generated in two organic layers, so that the range of spectral sensitivity can be broadened.

In fact, in view of the spectral sensitivities reported by Tang in the *Appl. Phys. Lett.*, it is considered that electric charges are generated in the perylene pigment layer when light with a wavelength of 450 to 550 nm is applied to the device, but in the CuPc layer, electric charges are generated when light of 550 to 700 nm is applied. The device according to Tang shows a higher fill factor (ff) than those of other devices. From this fact it is considered that in Tang's device, a stronger inner electric field is generated than those generated in other devices. The device according to Tang, however, still has the shortcomings described below.

(i) Since the organic layer is as thin as 300 to 500 Å, (which thickness is particularly described as a preferable thickness in Tang's article), it is liable to suffer from a problem of pin holes. According to the experiment carried out by the inventors of the present invention, the probability of the occurrence of the short-circuit between two electrodes due to pin holes is relatively high.

The area of the electrode of the Tang's device is only 0.1 cm² when an area of 1 cm² or more is necessary for practical use. Thus the production yield of a larger electrode will become a problem in practical use.

(ii) According to Tang, it is required that the electrode be in ohmic contact with each organic layer. He has reported that the value of $V_{oc}$ decreases when the device is composed of ITO, a perylene pigment, CuPc and Ag which are overlaid in this order. It is considered that this is because the ITO layer is not in ohmic contact with the perylene pigment layer, and the CuPc layer is not in ohmic contact with the Ag layer.

In order to attain this ohmic contact, a metal which is in contact with an electron-accepting organic material is required to be stable. Such a metal has a low work function, and In, Ag, Sn and Al are disclosed as such metals. However, these metals are readily oxidized.

SUMMARY OF THE INVENTION

Accordingly, a first object of the present invention is to provide an electric device comprising (i) an electron-conductive organic layer and (ii) an electrode made of a stable metal, which is capable of stably flowing a large amount of electric current without decreasing the current density.

A second object of the present invention is to provide a photoelectric conversion device using the above-described electric device.

The first object of the present invention can be attained by an electric device comprising a portion which comprises an electrode, an n-type inorganic semiconductor layer formed on the electrode, and an electron-conductive organic layer formed on the n-type inorganic semiconductor layer.

The second object of the present invention can be attained by a photoelectric conversion device comprising (a) a first electrode, (b) an n-type inorganic semiconductor layer formed on the first electrode, (c) an electron-conductive organic layer formed on the n-type inorganic semiconductor layer, which serves as an electron acceptor layer, (d) an electron donor layer, and (e) a second electrode, which are successively overlaid, and at least one electrode of the first electrode or the second electrode is transparent to the incident light.

BRIEF DESCRIPTION OF THE DRAWING

A more complete appreciation of the invention and many of the attendant advantages thereof will be readily obtained as the same becomes better understood with reference to the following detailed description when considered in connection with the accompanying drawing, wherein:

the sole FIGURE is a cross-sectional view of an example of a photoelectric conversion device according to the present invention.

DETAILED DESCRIPTION OF THE PREFERRED EMBODIMENTS

According to the present invention, a large amount of electric current can be obtained by an electric device which includes a portion comprising an electrode made of a metal having a work function of 4.5 eV or more, on which an n-type inorganic semiconductor layer and an electron-conductive organic layer are successively overlaid.

When a metal having a work function of 4.5 or more is brought into close contact with an electron-conductive organic layer, a Schottky junction is formed. This junction serves as an energy barrier to electrons which migrate from the electrode to the electron-conductive organic layer and vice versa.

In the case where an n-type inorganic semiconductor layer is interposed between the electrode and the electron-conductive organic layer, the bulk current capacity of the n-type inorganic semiconductor layer, and the junction current capacity between the n-type inorganic semiconductor layer and the electrode become larger than the bulk current capacity of the electron-conductive organic layer. In addition, the interface between the n-type inorganic layer and the electron-conductive organic layer becomes an ohmic junction, so that the current capacity of the whole device is not lowered.

In the present invention, the following materials are preferably employed for the electrode, the n-type inorganic semiconductor layer and the electron-conductive organic semiconductor layer.

Electrode: Metals having a work function of 4.5 eV or more, such as Au, Pd, Pt, Cr, Ni and C.

n-type inorganic semiconductor layer: n-type crystalline silicon, n-type amorphous silicon, phosphorous-doped amorphous silicon, ZnS, ZnO, trivalent-metal-doped ZnO, ZnSe, CdS, CdSe, and TiO. Of these, ZnO and CdS are more preferable for use in the present invention.

Electron-conductive organic semiconductor layer: electron acceptor compounds such as tetracyanoquinodimethane, tetracyanoethylene, dimethyldichlorobenzoquinone and trinitrofluorenone; perylene pigments such as Pigment Red (hereinafter referred to as "PR") 179, PR 190, PR 149, PR 13, PR 189 and Pigment Orange 26; perynone pigments such as Pigment Orange 43 and PR 194; quinone pigments such as PR 168, PR 177, PY 24 and Vat Yellow 4; conjugated polymeric materials such as polyacetylenes and polythiophenes, doped with K or Na; quinone-containing yellow pigments such as flavanthrone; and dyes such as Crystal Violet, Methyl Violet and Malachite Green.

In the present invention, the above-described electrode, the n-type inorganic semiconductor layer and the electron-conductive organic semiconductor layer are successively overlaid in this order. Other layers or a positive electrode layer may be overlaid on the electron-conductive organic semiconductor layer, if necessary.

For example, in the case of a photoelectric conversion device, an organic coloring layer in which positive holes can move, and a positive electrode layer are further provided, so that photoelectric conversion is conducted at the interface between two organic layers. In the case of an electroluminescent device, a luminescent layer is further provided.

EXAMPLE 1—1

ZnO was deposited onto an ITO-coated surface of a glass substrate by the DC magnetron sputtering method, the substrate being heated to a temperature of approximately 300° C., using an argon gas as the carrier gas for the sputtering. Thus, a ZnO layer, that is, an n-type inorganic semiconductor layer, with a thickness of approximately 1300 Å, was formed on the ITO electrode.

Perylene tetracarboxylic acid methylimide was deposited onto the ZnO layer by vacuum deposition, whereby an electron-conductive organic layer having a thickness of approximately 2000 Å was formed on the ZnO layer.

Gold was then deposited onto the above-formed organic layer by vacuum deposition so as to form a positive electrode. The facing area between the ITO electrode and the positive electrode was made 0.25 cm$^2$.

A lead line was attached to the two electrodes by using a silver paste. Thus, electric device No. 1—1 according to the present invention was obtained.

A voltage with a sweep rate of 6 mV/s was applied to the ITO electrode of the device thus obtained, and the electric current flowing through the device was measured at $\pm 1$ V As a result, the current density at $-1$ V was determined to be $-1.3 \times 10^{-3}$ A/cm$^2$.

A lead line was attached to the two electrodes by using

COMPARATIVE EXAMPLE 1—1

The procedure for Example 1—1 was repeated except that the ZnO layer formed as the n-type inorganic semiconductor layer in Example 1—1 was eliminated, whereby comparative electric device No. 1—1 was obtained.

A voltage with a sweep rate of 6 mV/s was applied to the ITO electrode of the device thus obtained, and the electric current flowing through the device was measured at ±1 V. As a result, the current density at −1 V was determined to be −7×10⁻⁵ A/cm².

EXAMPLE 1—2

The procedure for Example 1—1 was repeated except that the thickness of the perylene pigment layer formed in Example 1—1 as the electron-conductive organic layer was changed from about 2000 Å to 800 Å, whereby electric device No. 1-2 according to the present invention was obtained.

A voltage with a sweep rate of 6 mV/s was applied to the ITO electrode of the device thus obtained, and the electric current flowing through the device was measured at ±1 V. As a result, the current density at −1 V was determined to be −2.6×10⁻³ A/cm².

EXAMPLE 1—3

The procedure for Example 1—1 was repeated except that the perylene tetracarboxylic acid methylimide used in Example 1—1 to form the electron-conductive organic layer was replaced by a compound having the following formula, whereby electric device No. 1-3 according to the present invention was obtained.

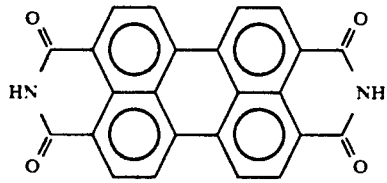

A voltage with a sweep rate of 6 mV/s was applied to the ITO electrode of the device thus obtained, and the electric current flowing through the device was measured at ±1 V. As a result, the current density at −1 V was determined to be −2.2×10⁻³ A/cm².

EXAMPLE 1—4

The procedure for Example 1—1 was repeated except that the perylene tetracarboxylic acid methylimide used in Example 1—1 to form the electron-conductive organic layer was replaced by a compound having the following formula, and that the thickness thereof was changed from about 2000 Å to 1300 Å, whereby electric device No. 1—4 according to the present invention was obtained.

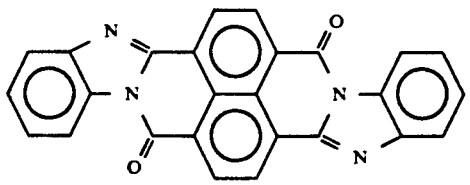

A voltage with a sweep rate of 6 mV/s was applied to the ITO electrode of the device thus obtained, and the electric current flowing through the device was measured at ±1 V. As a result, the current density at −1 V was determined to be −1.5×10⁻³ A/cm².

EXAMPLE 1—5

The procedure for Example 1—1 was repeated except that the perylene tetracarboxylic acid methylimide used in Example 1—1 to form the electron-conductive organic layer was replaced by a compound having the following formula, and that the thickness thereof was changed from about 2000 Å to 1300 Å, whereby electric device No. 1—5 according to the present invention was obtained.

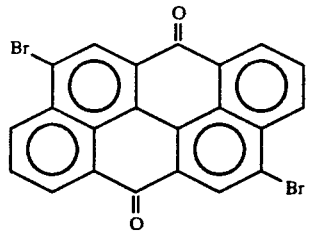

A voltage with a sweep rate of 6 mV/s was applied to the ITO electrode of the device thus obtained, and the electric current flowing through the device was measured at ±1 V. As a result, the current density at −1 V was determined to be −3.2×10⁻³ A/cm².

COMPARATIVE EXAMPLE 1—2

The procedure for Example 1—2 was repeated except that the ZnO layer formed in

Example 1—2 as the n-type inorganic semiconductor layer was eliminated, whereby comparative electric device No. 1—2 was obtained.

The device thus obtained was found to be short-circuited.

COMPARATIVE EXAMPLE 1—3

The procedure for Example 1—3 was repeated except that the ZnO layer formed in Example 1—3 as the n-type inorganic semiconductor layer was eliminated, whereby comparative electric device No. 1—3 was obtained.

A voltage with a sweep rate of 6 mV/s was applied to the ITO electrode of the device thus obtained, and the electric current flowing through the device was measured at ±1 V. As a result, the current density at −1 V was determined to be −1.3×10⁻⁴ A/cm².

COMPARATIVE EXAMPLE 1—4

The procedure for Example 1—4 was repeated except that the ZnO layer formed in Example 1—4 as the n-type inorganic semiconductor layer was eliminated, whereby comparative electric device No. 1—4 was obtained.

A voltage with a sweep rate of 6 mV/s was applied to the electrode of the device thus obtained, and the electric current flowing through the device was measured at ±1 V. As a result, the current density at −1 V was determined to be −2.3×10⁻⁵ A/cm².

COMPARATIVE EXAMPLE 1—5

The procedure for Example 1—5 was repeated except that the ZnO layer formed in Example 1—5 as the n-type inorganic semiconductor layer was eliminated, whereby comparative electric device No. 1—5 was obtained.

A voltage with a sweep rate of 6 mV/s was applied to the ITO electrode of the device thus obtained, and the electric current flowing through the device was measured at ±1 V. As a result, the current density at −1 V was determined to be −4.5×10⁻⁵ A/cm².

In summary, the effects of the electric device according to the present invention are as follows:

(a) The current density is maintained high.

(b) Even if the electron-conductive organic layer is thin, the probability of the occurrence of short-circuit caused by pin holes can be minimized.

The photoelectric conversion device according to the present invention can be prepared by using the above-described electric device of the present invention together with one or more electrodes. In this photoelectric conversion device, at least one electrode is transparent to light to be employed. Furthermore, the electron-conductive organic layer is coated with an electron donor type organic material so that it can serve as an electron acceptor layer. Namely, an n-type inorganic semiconductor layer, an electron-conductive organic layer which serves as an electron acceptor layer, an electron donor organic layer, and a second electrode are successively overlaid on a transparent first electrode in the photoelectric conversion device of the present invention.

The reasons why the conversion efficiency can be improved and the probability of the occurrence of the short-circuit can be reduced when the n-type inorganic semiconductor layer is present are not clear but is considered as follows:

REASONS FOR IMPROVEMENT IN CONVERSION EFFICIENCY (1) One electrode, the n-type inorganic semiconductor layer overlaid on the electrode, and the electron acceptor organic layer are in ohmic contact with one another. Electrons among the photoelectric charges generated at the interface between the electron acceptor organic layer and the electron donor organic layer can move freely without being hindered by a barrier.

(2) A junction is formed at the interface between the n-type inorganic semiconductor layer and the electron acceptor organic layer. Owing to this junction, positive holes generated upon application of light migrate to the organic layer, and electrons migrate to the inorganic semiconductor layer. Photoelectric charges are generated even at this interface.

(3) Electrons are supplied from the n-type inorganic semiconductor layer to the electron acceptor organic layer in the dark, so that the electric field generated at the interface between the electron acceptor organic layer and the electron donor organic layer becomes strong.

REASONS FOR REDUCTION OF PROBABILITY OF SHORT-CIRCUIT (1) The difference in level at the edge of the first electrode can be decreased when the n-type inorganic semiconductor layer exists.

(2) Even when pin holes are formed on the organic layer, no short-circuit is occurred. This is because the n-type inorganic semiconductor layer has resistance which is higher than that of the electrode.

Referring now to the accompanying drawing, the structure of the photoelectric conversion device according to the present invention will be explained.

On one surface of a transparent insulation substrate 1, a transparent first electrode 2, a transparent n-type inorganic semiconductor layer 3, an electron acceptor organic layer 4, an electron donor organic layer 5, and a second electrode 6 are successively overlaid in this order. lead wires 7 are connected to both the first electrode 2 and the second electrode 6.

The substrate 1 can be positioned on the side of the second electrode 6. In addition, the electron acceptor organic layer 4 and the electron donor organic layer 5 can be reversely provided. In this case, it is not necessary that the n-type inorganic semiconductor layer 3 be transparent; and the layer 3 is placed on the side of the second electrode 6. However, the most preferable structure is shown in the FIGURE.

The photoelectric conversion device fabricated in the above-described structure shows a high conversion efficiency although it contains organic materials.

The n-type inorganic semiconductor layer contributes to the improvement of the conversion efficiency, that is, the improvement of $V_{oc}$, $J_{sc}$ and ff, and to the reduction of the probability of the occurrence of the short-circuit. Furthermore, since the second electrode can be made of a stable metal having a work function of 4.5 eV or more, the electrode is free from oxidation.

The component layers of the photoelectric conversion device according to the present invention will be explained below.

(a) Transparent insulation substrate

Glass and a synthetic plastic film which can withstand a temperature of approximately 150° C. are suitably used as materials for the substrate.

(b) Transparent electrode

Indium tin oxide (ITO), tin oxide or indium oxide is used. Of these, ITO and tin oxide are preferable since transparency and electron conductivity are the essentially required properties. The thickness of the electrode is preferably 100 to 10000 Å.

(c) n-type inorganic semiconductor layer

The thickness of this semiconductor layer is preferably 10 to 10000 Å.

(d) Electron acceptor organic layer

The materials for the electron-conductive organic layer mentioned previously can be used for forming this layer.

This layer can be formed by vacuum deposition, spin coating or dipping. Of these, vacuum deposition is preferable in order to form a thin and uniform layer.

The thickness of the layer is preferably 100 to 3000 Å. However, in the case where the first electrode is transparent for projection of light, the preferred thickness of this layer is 100 to 1000 Å.

(e) Electron donor organic layer

Phthalocyanine pigments containing Cu, Zn, Co, Ni, Pb, Pt, Fe, Mg, Al or Ti as a center metal, phthalocyanine pigments containing no center metal, indigo and thioindigo pigments such as Pigment Blue 66 and Pigment Violet 36, quinacridone pigments such as Pigment Violet 19 and Pigment Red 122, and merocyanine dyes can be used for forming this layer.

This layer can be formed by vacuum deposition, spin coating, or dipping. Of these, vacuum deposition is preferable in order to form a thin and uniform layer.

The thickness of the layer is preferably 100 to 3000 Å. However, in the case where the second electrode is transparent for projection of light, the preferred thickness of this layer is 100 to 1000 Å.

(f) Second electrode

Metals having a work function of 4.5 eV or more, such as Au, Pt, Ni, Pd, Cu and Cr, can be used. Of these, Au is most preferable since it is highly stable.

The thickness of the electrode is preferably 50 to 3000 Å.

EXAMPLE 2—1

A glass substrate coated with ITO (ITO thickness: 900 Å) made by Matsuzaki Vacuum K.K. was thoroughly washed. ZnO was deposited onto the surface of the ITO-coated surface of the glass substrate by the DC magnetron sputtering method with the substrate heated to a temperature of approximately 300° C., using argon gas as the carrier gas for the sputtering. Thus, a ZnO layer, that is, an n-type inorganic semiconductor layer, with a thickness of approximately 2800 Å was formed on the ITO first electrode.

Perylene tetracarboxylic acid methylimide was deposited onto the ZnO layer by vacuum deposition at room temperature, whereby an electron acceptor organic layer with a thickness of approximately 500 Å was formed on the ZnO layer. Thereafter, aluminum phthalocyanine chloride (AlClPc) was deposited onto the above-formed electron acceptor organic layer, thereby forming an electron donor organic layer having a thickness of approximately 400 Å.

Gold was then deposited onto the AlClPc layer by vacuum deposition so as to form a second electrode. The facing area between the first electrode and the second electrode was made 0.25 cm$^2$.

Lead wires were attached to the above two electrodes by using a silver paste. Thus, photoelectric conversion device No. 2—1 according to the present invention was obtained.

The conversion efficiency of the device thus obtained was determined by applying a pseudo sun light (AM-1.5) with an intensity of 75 mW/cm$^2$ and a voltage with a sweep rate of 6 mV/s to the ITO electrode. As a result, it was found that $V_{oc}$ was 0.47 V, ff was 0.45, and $J_{sc}$ was 2.58 mA/cm$^2$. From the above data, the conversion efficiency was determined to be 0.74%.

COMPARATIVE EXAMPLE 2—1

The procedure for Example 2—1 was repeated except that the ZnO layer formed in Example 2—1 as the n-type inorganic semiconductor layer was eliminated, whereby photoelectric conversion device No. 2—1 according to the present invention was obtained.

The conversion efficiency of this device was determined in the same method as in Example 2—1. As a result, it was found that $V_{oc}$ was 0.26 V, ff was 0.33 and Jhd sc was 2.0 mA/cm$^2$. From the above data, the conversion efficiency was determined to be 0.23%. The values of scattered widely, and they were mostly in a range of 0.26 V or less.

EXAMPLE 2—2

The procedure for Example 2—1 was repeated except that the thickness of the electron acceptor organic layer was hanged from 500 Å to 800 Å, and that aluminum phthalocyanine chloride used in Example 2—1 for forming the electron donor organic layer was replaced by titanyl phthalocyanine (TiOPc), and that the thickness of the TiOPc layer was changed from 400 Å to 300 Å, whereby photoelectric conversion device No. 2—2 according to the present invention was obtained.

The conversion efficiency of this device was determined in the same method as in Example 2—1. As a result, it was found that $V_{oc}$ was 0.5 V, ff was 0.46 and $J_{sc}$ was 1.6 mA/cm$^2$. From the above data, the conversion efficiency was determined to be 0.5%.

COMPARATIVE EXAMPLE 2—2

The procedure for Example 2—2 was repeated except that the ZnO layer formed in Example 2—2 as the n-type inorganic semiconductor layer was eliminated, whereby comparative photoelectric conversion device No. 2—2 was obtained.

The conversion efficiency of this device was determined in the same method as in Example 2—1. As a result, it was found that $V_{oc}$ was 0.44 V, ff was 0.39 and $J_{sc}$ was 0.99 mA/cm$^2$. From the above data, the conversion efficiency was determined to be 0.22%.

EXAMPLE 2—3

The procedure for Example 2—1 was repeated except that the thickness of the ZnO layer formed in Example 2—1 as the n-type inorganic semiconductor layer was changed from 2800 Å to 500 Å, whereby photoelectric conversion device No. 2—3 according to the present invention was obtained.

The conversion efficiency of this device was determined in the same method as in Example 2—1. As a result, it was found that $V_{oc}$ was 0.47 V, ff was 0.45 and $J_{sc}$ was 2.46 mA/cm$^2$. From the above data, the conversion efficiency was determined to be 0.69%.

EXAMPLE 2—4

The procedure for Example 2—1 was repeated except that the thickness of the ZnO layer formed in Example 2—1 as the n-type inorganic semiconductor layer was changed from 2800 Å to 6000 Å, whereby photoelectric conversion device No. 2—4 according to the present invention was obtained.

The conversion efficiency of this device was determined in the same method as in Example 2—1. As a result, it was found that $V_{oc}$ was 0.48 V, ff was 0.43 and $J_{sc}$ was 2.55 mA/cm$^2$. From the above data, the conversion efficiency was determined to be 0.7%.

EXAMPLE 2—5

The procedure in Example 2—1 was repeated except that the argon gas used in Example 2—1 at the time of the formation of the ZnO layer was replaced by a 1:1 mixed gas of argon and oxygen, and the thickness of the ZnO layer was changed from 2800 Å to 1000 Å, whereby photoelectric conversion device No. 2—5 according to the present invention was obtained.

The conversion efficiency of this device was determined in the same method as in Example 2—1. As a result, it was found that $V_{oc}$ was 0.47 V, ff was 0.45 and $J_{sc}$ was 2.2 mA/cm$^2$. From the above data, the conversion efficiency was determined to be 0.62%.

EXAMPLE 2—6

The procedure for Example 2—1 was repeated except that the argon gas used in Example 2—1 at the time of the formation of the ZnO layer was replaced by a 1:1 mixed gas of argon and oxygen, and the thickness of the ZnO layer was changed from 2800 Å to 600 Å, whereby photoelectric conversion device No. 2—6 according to the present invention was obtained.

The conversion efficiency of this device was determined in the same method as in Example 2—1. As a result, it was found that $V_{oc}$ was 0.47 V, ff was 0.43 and $J_{sc}$ was 1.9 mA/cm$^2$. From the above data obtained, the conversion efficiency was determined to be 0.51%.

EXAMPLE 2—7

The procedure for Example 2—1 was repeated except that the ZnO used in Example 2—1 for forming the n-type inorganic semiconductor layer was replaced by ZnO doped with 2% of aluminum, whereby photoelectric conversion device No. 2—7 according to the present invention was obtained.

The conversion efficiency of this device was determined in the same method as in Example 2—1. As a result, it was found that $V_{oc}$ was 0.47 V, ff was 0.43 and $J_{sc}$ was 1.9 mA/cm$^2$. From the above data, the conversion efficiency was determined to be 0.7%.

The above examples and comparative examples demonstrate that the photoelectric conversion devices according to the present invention show a high conversion efficiency although they contain organic materials as the electron acceptor and donor materials.

What is claimed is:

1. An electric device comprising a portion which comprises an electrode, an n-type inorganic semiconductor layer formed on said electrode, and an electron-conductive organic layer formed on said n-type inorganic semiconductor layer, wherein said electrode is made of C or a metal having a work function of 4.5 eV or more.

2. The electric device as claimed in claim 1, wherein said n-type inorganic semiconductor layer comprises a material selected from the group consisting of an n-type crystalline silicon and an n-type amorphous silicon.

3. The electric device as claimed in claim 1, wherein said n-type inorganic semiconductor layer comprises a material selected from the group consisting of zinc oxide, zinc sulfide, and zinc selenide.

4. The electric device as claimed in claim 1, wherein said n-type inorganic semiconductor layer comprises a material selected from the group consisting of cadmium sulfide and cadmium selenide.

5. The electric device as claimed in claim 1, wherein said electron-conductive organic layer comprises an electron acceptor compound.

6. The electric device as claimed in claim 1, wherein said electron-conductive organic layer comprises a perylene pigment.

7. The electric device as claimed in claim 1, wherein said electron-conductive organic layer comprises a quinone pigment.

8. The electric device as claimed in claim 1, wherein said electron-conductive organic layer comprises a perynone pigment.

9. The electric device as claimed in claim 1, wherein said electron-conductive organic layer comprises a conjugated polymeric material selected from the group consisting of a polyacetylene and a polythiophene which are doped with potassium or sodium.

10. The electron device as claimed in claim 1, wherein said electron-conductive organic layer comprises a quinonecontaining yellow pigment.

11. The electron device as claimed in claim 1, wherein said electron-conductive organic layer comprises a dye selected from the group consisting of Crystal Violet, Methyl Violet and Malachite Green.

12. The electric device as claimed in claim 1, wherein said n-type inorganic semiconductor layer comprises a phosphorous-doped amorphous silicon.

13. The electric device as claimed in claim 1, wherein said electrode is made of Au, Pd, Pt, Cr, Ni or C.

* * * * *